US008519875B2

(12) United States Patent
Straayer et al.

(10) Patent No.: US 8,519,875 B2
(45) Date of Patent: Aug. 27, 2013

(54) SYSTEM AND METHOD FOR BACKGROUND CALIBRATION OF TIME INTERLEAVED ANALOG TO DIGITAL CONVERTERS

(75) Inventors: Matthew Allen Zornig Straayer, Acton, MA (US); Hae-Seung Lee, Lexington, MA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/443,297

(22) Filed: Apr. 10, 2012

(65) Prior Publication Data

US 2012/0262318 A1 Oct. 18, 2012

Related U.S. Application Data

(60) Provisional application No. 61/474,401, filed on Apr. 12, 2011.

(51) Int. Cl.
*H03M 1/10* (2006.01)

(52) U.S. Cl.
USPC ........... 341/120; 341/144; 327/517; 714/704; 714/E11.004; 375/316; 375/324; 375/343; 345/418

(58) Field of Classification Search
USPC ................ 341/120–155; 327/517; 714/704, 714/E11.004; 375/316, 324, 343; 345/456.1, 345/418
See application file for complete search history.

(56) References Cited

U.S. PATENT DOCUMENTS

| 7,075,474 | B2 * | 7/2006 | Yamagata et al. ............ 341/169 |
| 7,330,140 | B2 * | 2/2008 | Balakrishnan et al. ....... 341/118 |
| 8,159,377 | B2 * | 4/2012 | Goldman et al. ............. 341/118 |
| 2009/0167575 | A1 * | 7/2009 | Mitani et al. ................. 341/118 |
| 2012/0001781 | A1 * | 1/2012 | Scanlan ....................... 341/110 |
| 2012/0050079 | A1 * | 3/2012 | Goldman et al. ............. 341/118 |
| 2012/0235841 | A1 * | 9/2012 | Gomez et al. ................ 341/118 |

OTHER PUBLICATIONS

A 12-GS/s 81-mW 5-bit Time-Interleaved Flash ADC with Background Timing Skew Calibration, Manar El-Chammas and Boris Murmann; 2010 Symposium on VLSI Circuits/Technical Digest of Technical Papers, Document No. 978-1-4244-7641-1/10/$26.00 ©2010 IEEE. 2 Pages.
"A 12-GS/s 81-mW 5-bit Time-Interleaved Flash ADC With Background Timing Skew Calibration", Manar El-Chammas, and Boris Murmann. IEEE Journal of Solid-State Circuits, vol. 46, No. 4, Apr. 2011. 10 Pages.

* cited by examiner

*Primary Examiner* — Lam T Mai
(74) *Attorney, Agent, or Firm* — North Weber & Baugh LLP

(57) ABSTRACT

Various embodiments allow for background calibration of channel-to-channel mismatch errors. In certain embodiments calibration is accomplished by comparing the output of I-ADCs against the output of a reference ADC and correlating the difference to a known function to obtain a correction signal that can be used to correct channel-to-channel mismatch errors.

22 Claims, 11 Drawing Sheets

SYSTEM AND METHOD FOR BACKGROUND CALIBRATION OF TIME INTERLEAVED ANALOG TO DIGITAL CONVERTERS

CROSS REFERENCE TO RELATED PATENT APPLICATIONS

This application claims priority to U.S. Provisional Application Ser. No. 61/474,401, entitled "SYSTEM AND METHOD FOR BACKGROUND CALIBRATION OF TIME-INTERLEAVED ANALOG-TO-DIGITAL CONVERTERS," filed Apr. 12, 2011, which application is incorporated herein by reference in its entirety.

BACKGROUND

A. Technical Field

The present invention relates to interleaved analog-to-digital converters, and more particularly, to systems, devices, and methods of calibrating channel-to-channel mismatch error caused by one or more sources in interleaved analog-to-digital converters.

B. Background of the Invention

Time interleaved analog-to-digital converter (I-ADC) technology allows for power-efficient, high-speed sampling and digitization of analog input signals. In single ADC channel architectures, three competing parameters 1) precision, 2) speed, and 3) power are typically traded against each other. An I-ADC architecture allows the challenges of achieving high levels of precision to be separated from the challenges of operating at high speeds. In this way, power consumption required to achieve a given sampling rate may be optimized. Generally, I-ADC technology is the preferred option to achieve extremely high-speed sampling rates.

An I-ADC is a type of converter array with multiple parallel sampling channels. The sampling frequency of each channel does not need to satisfy the Nyquist criterion individually, rather the sampling frequency of the combined output of all channels in the I-ADC should satisfy the Nyquist criterion. Under ideal conditions, the sampling rate of I-ADCs increases proportionally to the number of interleaved parallel ADC channels. In practice, each ADC channel introduces a number of component errors, such as phase shift errors in the clock signals. I-ADCs are known to give rise to new performance limiting errors that are caused by transfer path mismatch (e.g. propagation delay), gain, and offset mismatch between the multiple ADC channels.

The types of mismatch that requires calibration can generally be categorized into timing skew mismatch, bandwidth mismatch, offset mismatch, gain mismatch, and static non-linearity mismatch. The combined channel mismatch error may modulate nonlinearly with the unknown analog input signal and create signal-dependent error terms that further limit I-ADC performance. Moreover, drifts temperature, power supply voltage, and other environmental conditions may change the mismatch error over time, which requires additional mismatch calibration.

Although many solutions have been proposed to minimize, compensate, or calibrate the various sources of mismatch, mismatch error remains a bottleneck for high-precision, high-speed sampling of high-frequency input signals.

In order to correct for each mismatch error, a method is required for correlating the error of interest with an observable output signal, which is often the digital output signal of one or more channels forming the array in the I-ADC. To achieve convergence, the correlation of each mismatch error to its observable output signal must be sufficiently large for the analog input signal present at the ADC input. Additionally, the mismatch error must be sufficiently independent of other mismatch errors.

What is needed are systems, devices, and methods for background calibration of I-ADC circuits to overcome the above-described limitations.

SUMMARY OF THE INVENTION

Various embodiments of the invention provide for background calibration of I-ADCs. This calibration reduces channel-to-channel mismatch errors such as timing skew, gain error, DC offset error, and static non-linearity, etc. caused by a number of sources within high-speed I-ADCs.

In certain embodiments of the invention, channel-to-channel mismatch errors are corrected by comparing the output of a pre-calibrated reference ADC to the output of sub-ADCs, associating the difference with a known error signature, and feeding back a correction signal to the I-ADCs to correct for specific channel-to-channel mismatch errors.

Certain embodiments of the invention take advantage of information derived from the input signal to define a function representing a known mismatch error. The function is correlated with a computed mismatch error to generate an estimate value for each type of mismatch error. From the estimate value, a control circuit within a sub-ADC generates the correction signal that is used to minimize or correct the mismatch error.

In various embodiments, the reference ADC samples the analog input signal in a predetermined timing relationship with respect to the sub-ADCs, such that sampling locations of the reference ADC align with respective sampling locations of the sub-ADCs at predetermined intervals.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

Figure 1:
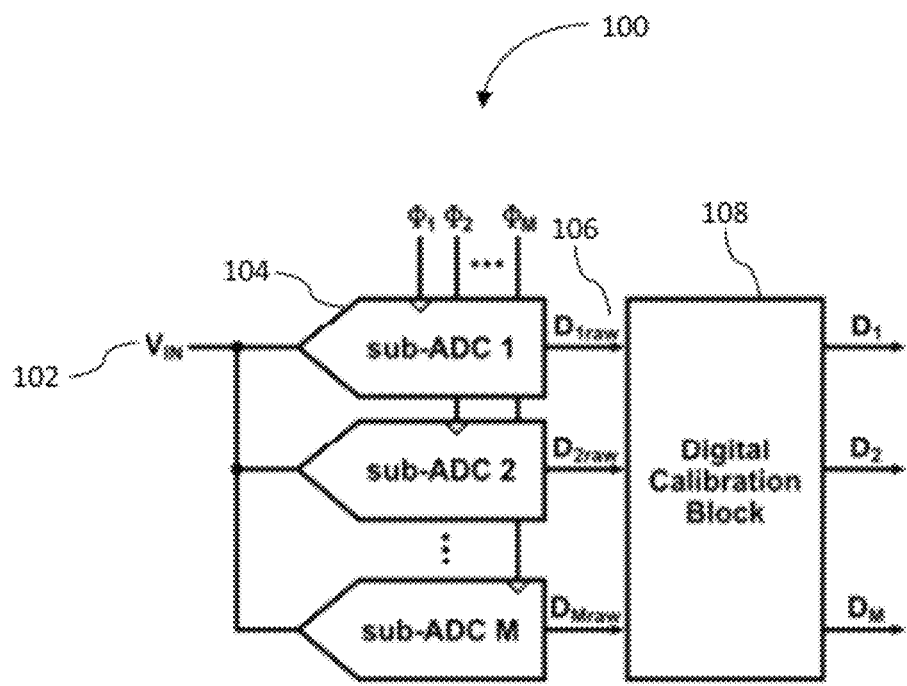
FIG. 1 is a block diagram of a prior art I-ADC apparatus.

FIG. 1 shows a prior art optimization technique using an I-ADC apparatus 100 to perform background calibration of a mismatch errors. Common input signal 102 is input into M number of interleaved sub-ADCs 104. Each ADC sequentially samples input signal 102 once per M aggregate ADC samples. Digital output data 106 denoted $D_{iRAW}$ of sub-ADC 104 is then input to digital calibration block 108, which performs an open-loop background calibration of mismatch errors on interleaved sub-ADCs 104.

Since common input signal 102 is unknown, assumptions regarding the statistical properties of input signal 102 are made for the calibration to converge. Unfortunately, statistical properties of input signal 102 may change over time, or input signal 102 may contain the same frequency at which a particular mismatch distortion manifests itself (e.g., $F_S/M$). Further, it may be very difficult to identify the mismatch error that is causing the corresponding distortion tones in the spectrum, and even more difficult to minimize it. As a result, a practical ADC calibration using this optimization technique may be ill-conditioned causing a non-convergent system that fails to minimize or correct the mismatch error.

Recent work has acknowledged this limitation by introducing a new observable output to the I-ADC system that describes the ADC input signal. The extra output, when combined with the outputs of the existing M ADC channels, can potentially lead to a convergent system provided the extra output introduces sufficient new information to the system.

Figure 2:
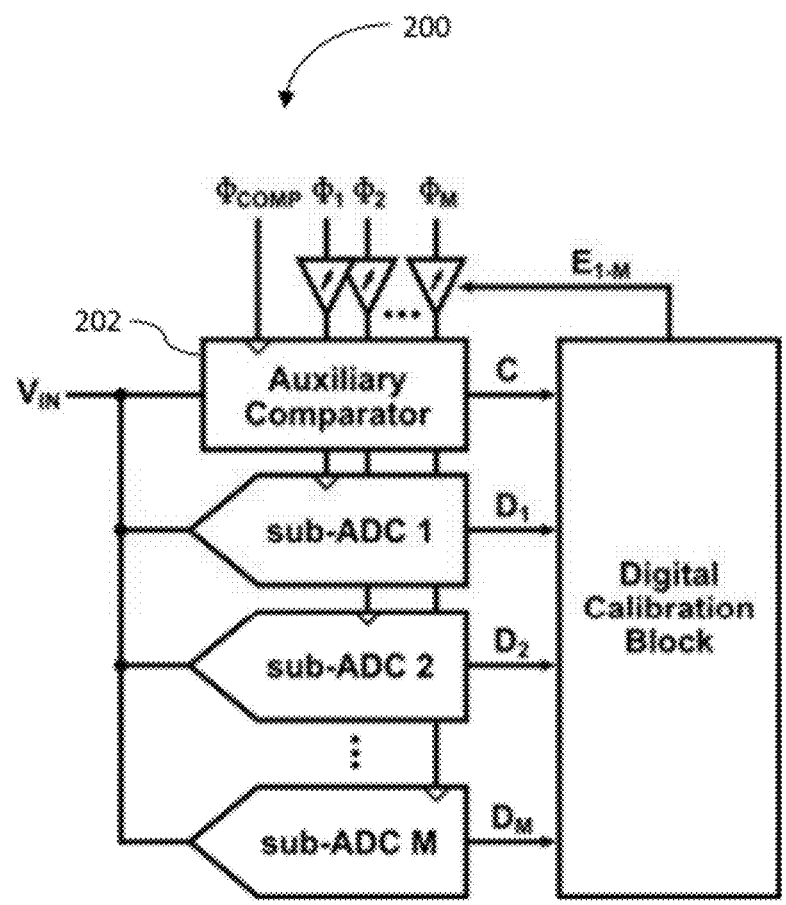
FIG. 2 is a block diagram of another prior art interleaving ADC apparatus.

FIG. 2 is a block diagram of prior art I-ADC apparatus employing a comparator-based background calibration. Digital calibration block 202 uses feedback information 204 to calibrate for errors in sub-ADC 206, such as delay, which is proportional to the phase of each sampling time. The use of auxiliary comparator 208 is aimed at minimizing the channel-to-channel mismatch error caused by timing skew. With a single sampler as the timing reference, periodic sampling locations of the auxiliary ADC will occur at integer multiples of the period that is defined by the overall sampling rate.

Figure 3:
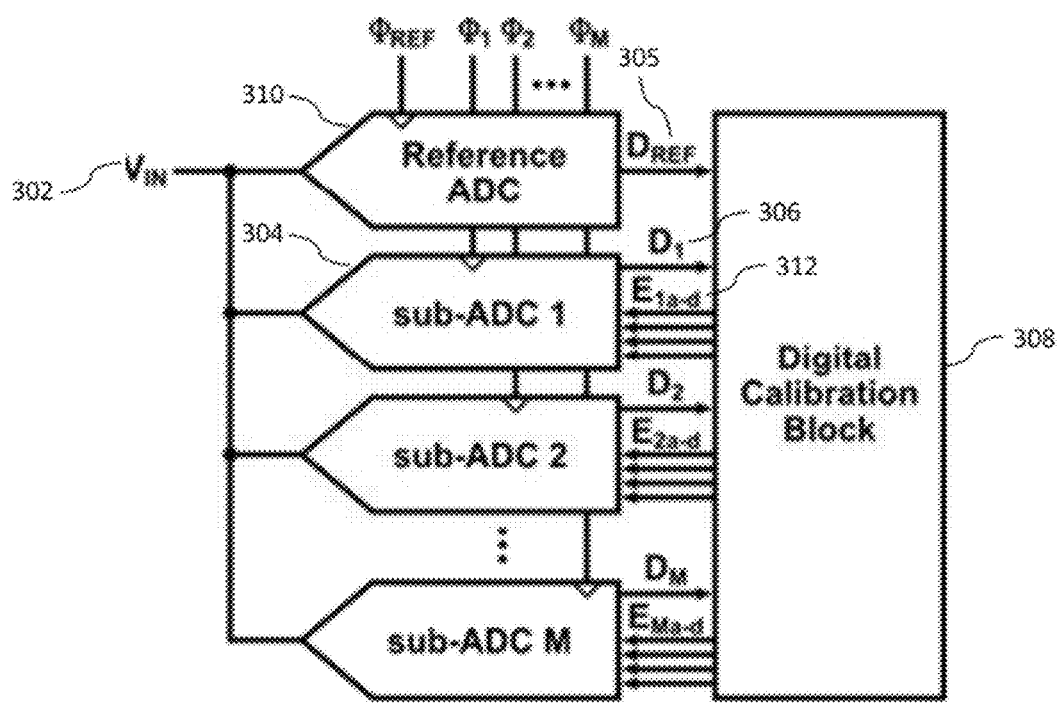
FIG. 3 is a block diagram of an interleaving ADC apparatus, according to various embodiments.
Figure 4:
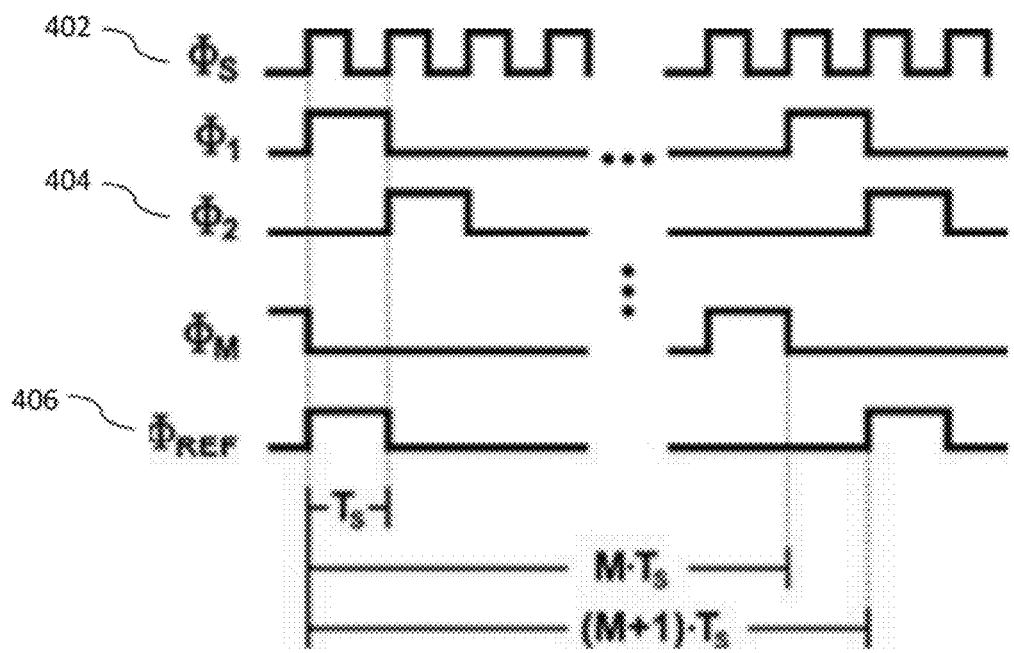
FIG. 4 is a timing diagram of an interleaving ADC calibration, according to various embodiments.

FIG. 3 is a block diagram of an interleaving ADC apparatus with background calibration, according to various embodiments. Calibration occurs in the background and without interrupting the conversion process. In one embodiment, common input signal 302 is input into M number of interleaved sub-ADCs 304 used for M-way interleaving. Reference ADC 310 is a multi-bit quantizer having an accuracy that is equal to or larger than the accuracy of sub-ADC 304. Reference ADC 310 samples input signal 302 at a predetermined timing relationship with respect to each sub-ADC 304, as shown in FIG. 4. Reference ADC 310 may receive the clock signals through a variable delay cell (not shown). The delay may be controlled by a digital feedback word from digital calibration block 308.

Adding reference ADC 310 results in a total of M+1 ADC channels. Each channel converts input signal 302 into a digital output resulting in a set of M+1 ADC digital outputs that may be in any form that contains information about input signal 302. The information aids in the correction of channel-to-channel mismatch errors. Specifically, reference ADC parameters, such as sampling time, offset, gain, integral non-linearity, etc., can be defined to serve as reference data against which sub-ADC parameters are computed to calibrate sub-ADC 304. The reference ADC's own parameters may be calibrated in the foreground or background by any technique known to those skilled in the art.

Digital data output 306 from each sub-ADC channel 304 is forwarded to digital calibration block 308. In one embodiment, digital calibration block 308 is placed in feedback with reference ADC 310 and sub-ADC 304 (or equivalently one digital calibration block for each channel). Digital calibration block 308 is coupled to receive the M digital outputs 306 of sub-ADC channels 304 and the output data 305 of reference ADC channel 310. For each type of mismatch error to be corrected and for each channel, digital calibration block 308 may store and adjust an estimate of the specific mismatch error. Each of sub-ADC channels 306 is coupled to receive from digital calibration block 308 analog or digital feedback control signals 312 for each mismatch error. Feedback control signals 312 are used to correct the mismatch errors within each interleaved sub-ADC 304 either through appropriate analog or digital methods. In another embodiment, digital calibration block 308 corrects for mismatch errors without feedback control signals in such way that the mismatch errors are corrected in the digital domain by the digital calibration block 308.

In one embodiment, all ADCs 304, 310 receive analog input signal 302 to be sampled either directly or indirectly through an input signal conditioning circuit, such as a buffer (not shown). The buffer may be used to limit disturbances resulting from the high-speed sampling process.

FIG. 4 is a timing diagram of an interleaving ADC calibration illustrating the sampling period of the sub-ADCs with respect to the sampling period of the reference ADC, according to various embodiments. In one embodiment, each ADC consecutively samples the analog input signal once per M aggregate ADC samples, such that each sampling edge of clock signals 402 is separated by a period of $T_S$ resulting in a sample time of $M \cdot T_S$ for each ADC channel. The reference ADC channel samples the analog input signal at rate equal to or slower than $M \cdot T_S$, such that, over time, the reference ADC sampling locations at clock signal 406 sequentially align with the sampling locations of clock signal 404 for each of the M sub-ADC channels. For example, if the reference ADC were to sample once per M+1 aggregate samples, assuming that the timing delay between the clock and the sampling location were comparable for the reference channel the sub-ADC channels, then, over a period of M·(M+1) aggregate samples, the reference ADC sampling locations will rotate through each of the approximate sampling locations for each of the sub-ADC channels. One skilled in the art will appreciate that there is a very large set of different sampling rates, fixed or variable, for the reference ADC that can perform this function.

Returning to FIG. 3, once reference ADC 310 completes quantizing its sampled input, it outputs digital data 306, which is then input to digital calibration block 308. Digital output data 305 and 306 may be in any form that contains information about analog input signal 302, including redundant information regarding the stage bit decisions if sub-ADC 304 is a subranging (or pipeline) ADC.

Figure 5:
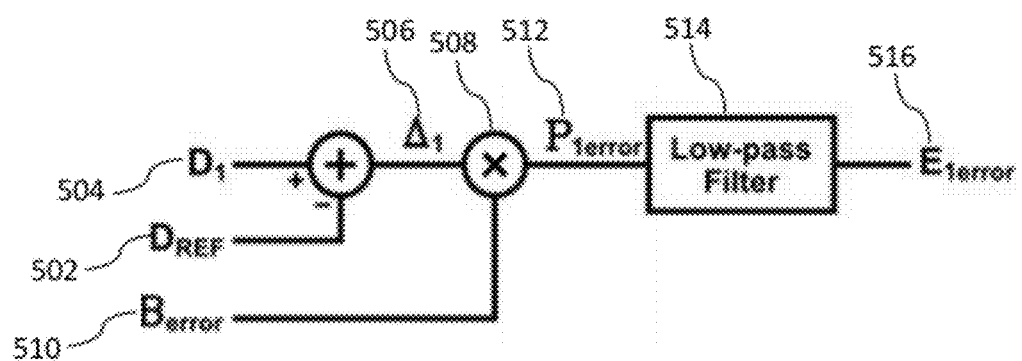
FIG. 5 is a schematic illustrating the correlation of channel-to-reference error with a correlation basis function, according to various embodiments.

FIG. 5 is a schematic illustrating the correlation of channel-to-reference error with a correlation basis function, according to various embodiments. In one embodiment, reference ADC encoded digital output data 502 is subtracted from each sub-ADC output data 504, with difference 506 (also called channel-to-reference error) representing errors due to mismatch between the respective sub-ADC channel and the reference ADC. Reference ADC parameters, such as sampling time, offset, gain, integral non-linearity, etc., may be defined to serve as parameters against which sub-ADC output data 504 is measured. For each sub-ADC output data 504, channel-to-reference error 506 is input to distinct multipliers 508 to correlate against the parameters of the reference ADC. Specifically, for each mismatch error of interest, channel-to-reference error 506 is multiplied with correlation basis function 510 that is specific to that error to produce correlation output 512$P_{ij}$, where i denotes the channel index and j denotes the mismatch index.

The multiplication may be implemented within the digital calibration block and with various levels of accuracy, ranging from 1 bit to more than 16 bits. Further, the multiplication may be trivial or simply implied by choice of correlation basis function 510. However, to achieve good convergence, correlation output 512 is preferably large in magnitude for strong correlations, small in magnitude for weak correlations, and the sign of correlation output 512 should indicate the polarity of the mismatch error. For mismatch sources that are independent of each other, in determining correlation basis function 510 for a specific error, all other mismatch errors may be assumed to equal zero, and each correlation basis function 510 is ideally orthogonal to other correlation basis functions. Correlation basis function 510 may be dependent on any information regarding the signal or quantized output of interest, such as slope, frequency, ADC decisions, etc.

Correlation outputs 512 may be filtered by a low-pass filter 514 (e.g., an integrator) to provide a large amount of data oversampling or averaging. Each filter output describes an estimate 516 of the mismatch error as translated through the control circuits in each sub-ADC channel. Error estimates 516 are fed back to the respective control circuit in such a manner as to subtract or cancel the specific error in a direct or indirect methods. Over time, error estimate 516 will converge to a steady state value that is ideally the same or close to the actual mismatch error. Therefore, each sub-ADC will be corrected to match the characteristics of the reference ADC. To the extent that the reference ADC is not ideal in terms of offset, gain, and linearity, for each sub-ADC the calibration loop will settle to the error present in the reference ADC. As previously described, the mismatch parameters of the reference ADC (e.g., offset, gain, linearity, etc.) may be calibrated in the foreground or in the background. In one embodiment, the bandwidth of the calibration block is set only large enough to initially settle within a reasonable amount of time and to track drifts (e.g. in temperature, power supply voltage, etc.). Typical values for a sufficient closed-loop bandwidth are between 1 kHz and 20 kHz.

Figure 6:
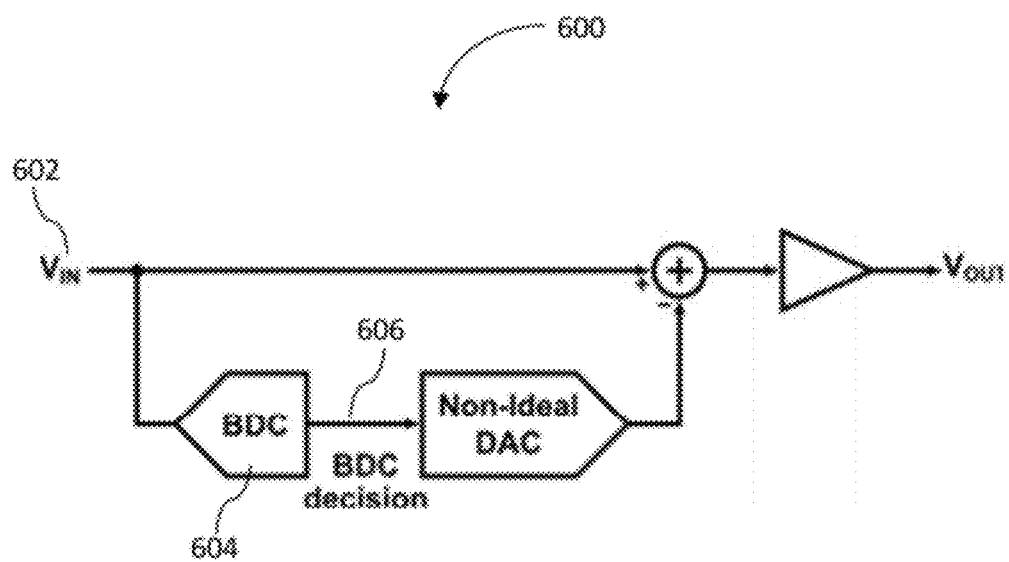
FIG. 6 is a block diagram of a prior art subranging (or pipeline) ADC stage.

FIG. 6 is a block diagram of a prior art subranging (or pipeline) ADC stage. A classical subranging (or pipeline) ADC with a typical stage 600 is shown in FIG. 6. It is well-known to those skilled in that art that one of the dominant sources of integral non-linearity in pipeline ADC is first stage conversion random capacitor mismatch. Capacitor mismatch in the stage DAC causes nonlinearity in analog-to-digital conversion, and can be viewed as channel-to-reference offset error conditioned on the decision of bit-decision comparator (BDC, also called FLASH) 604. Each time a particular BDC decision 606 is made, a non-ideal amount of charge is subtracted from the charge that represents input signal 602. Therefore, with knowledge of both BDC decision 606 and the ideal quantization output (i.e., the output from the reference ADC), the correlation circuit will measure or estimate the amount of non-ideal charge added for each respective BDC decision 606. Once the error estimate is known, the correction can be made in an analog (subtracting BDC-dependent charge in the stage) or digital fashion (subtracting values from the output word).

Figure 7:
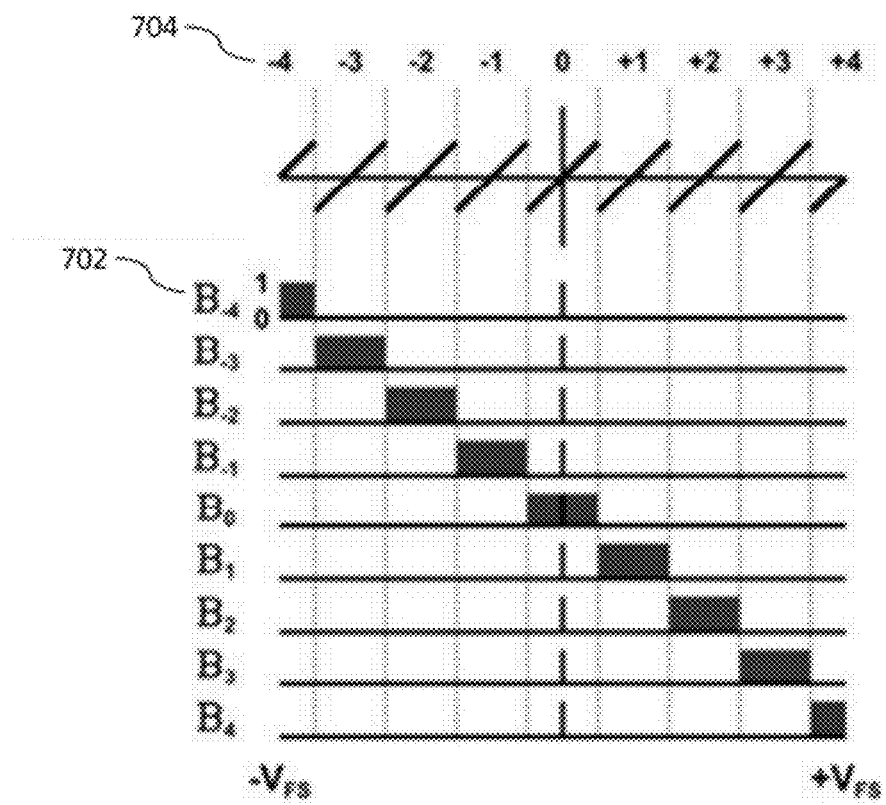
FIG. 7 illustrates an example set of correlation basis functions for static mismatch error for an ADC, according to various embodiments.

FIG. 7 illustrates a set of correlation basis functions for static mismatch errors, such as gain, offset, and non-linearity, for an exemplary ADC with a 2.5-bit first stage, according to various embodiments. In one embodiment, each possible BDC decision 704 has a correlation basis function 702 that is set equal to 1 for the respective BDC decision 704 and equal to 0 otherwise. As a result, the multiplication of the channel-to-reference error with correlation basis function 702 can be implemented, for example, with clock gating. Other sources of static non-linearity in the ADC may be reduced together with the capacitor mismatch error in a piece-wise fashion, boundaries of segments demarcated by BDC decisions 704. It is also possible that the piece-wise function can be extended to have larger or smaller numbers of segments with or without regard for BDC decisions 704.

The output-referred offset for a sub-ADC is equal to the average output of the sub-ADC with zero voltage input subtracted by the ideal output word, which is the reference ADC output. Therefore, the correlation basis function 702 for offset error can be set equal to 1. However, this choice of correlation basis function 702 is not orthogonal to the nonlinearity correlation basis functions discussed earlier. If more than one mismatch error is to be estimated, cross-correlation between the mismatch errors should be avoided. To illustrate, a BDC decision 704 of +1 and a channel-to-reference error of −2 would cause a non-zero P for both offset as well as non-linearity correlations, such that the calibration block would attempt to calibrate each type of mismatch error. A number of solutions can be employed to deal with non-orthogonality. In one embodiment, the offset estimate can be taken to be the average of the non-linear corrections and simply subtracted from the ADC output word. Alternatively, the non-linearity calibration can completely assume responsibility for the offset correction. In both cases, the offset correlation basis function is unnecessary and can be eliminated entirely.

For correlating the channel-to-reference error with gain error, as the offset correlation basis function of 1 is not orthogonal to each correlation basis function 702, a similar issue of orthogonality exists for the gain correlation basis function. The channel-to-reference error will be linearly dependent on the gain error for both sign and magnitude. Therefore, although the gain error correlation basis function 702 could simply be set to the reference ADC output, this approach could impact the non-linearity estimates. In one embodiment, the gain error is estimated by taking a weighted sum of the non-linear estimates. In an alternative embodiment, where the non-linearity calibration is not utilized, the gain and offset correlation basis functions described previously are orthogonal and can be used to solve for both mismatch errors. The gain correction can be implemented with digital multiplication of the ADC output word, by modulation of the reference voltage used within the ADC, or with other methods.

Figure 8:
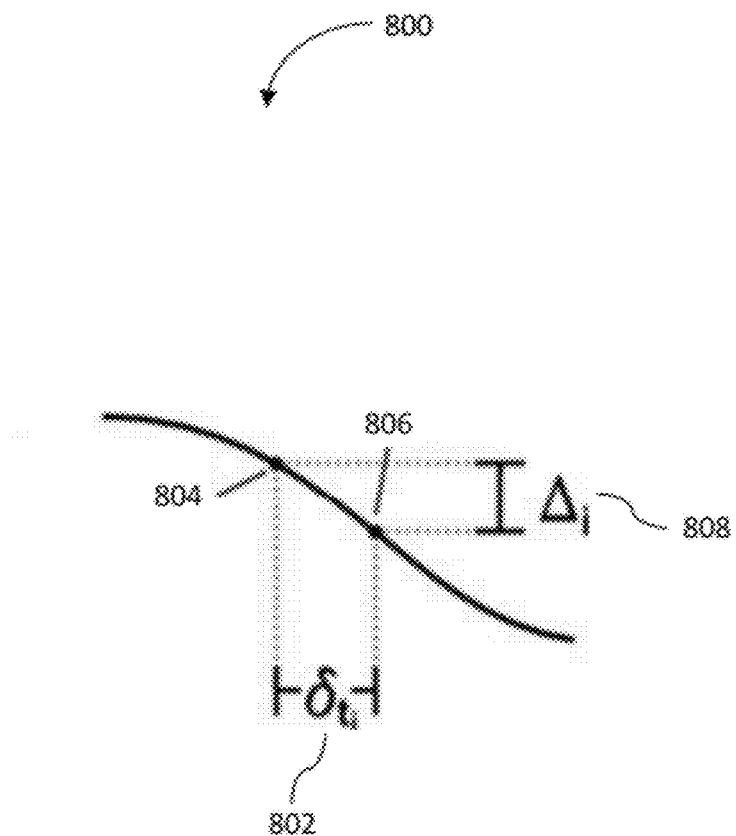
FIG. 8 illustrates a relationship of timing skew to channel-to-reference error.

FIG. 8 illustrates a relationship of timing skew error to channel-to-reference error. In one embodiment, the correlation basis function for timing skew error will indicate the size of the timing skew error 802 as well as the polarity. Timing skew error 802 $\delta_{ti}$ is defined as the absolute time of the $i^{th}$ sub-ADC channel sample 804 subtracted by the absolute time of the reference ADC sample 806. If $\Gamma_{IN}(t)$ is the slope of the ADC input signal at the reference ADC sampling location, and assuming that the frequencies of the ADC input signal have periods that are very large compared with the timing skew, then channel-to-reference error 808 calculates to $\Delta_i \approx \Gamma_{IN} \cdot \delta_{ti}$. To find the actual timing skew error 802, given that $\delta_{ti} \approx \Delta_i / \Gamma_{IN}$, channel-to-reference error 808 can be correlated with an estimate of the slope of the ADC input signal at the time of sampling of the reference ADC.

To construct a correlation basis function that contains information about the input slope $\Gamma_{IN}$, multiple existing pieces of information can be leveraged, and there are many circuits that can be devised to estimate the input slope. In one embodiment, the existing information regarding the input signal can be leveraged so as not to require additional analog circuits in the ADC. To this end, it can be helpful to utilize knowledge of the input signal's maximum frequency. If the input frequency is well below the first Nyquist zone (i.e., the maximum input frequency is well below $F_S/2$), then the polarity of the slope can be estimated by a discrete time differentiation of the overall ADC output.

Figure 9:
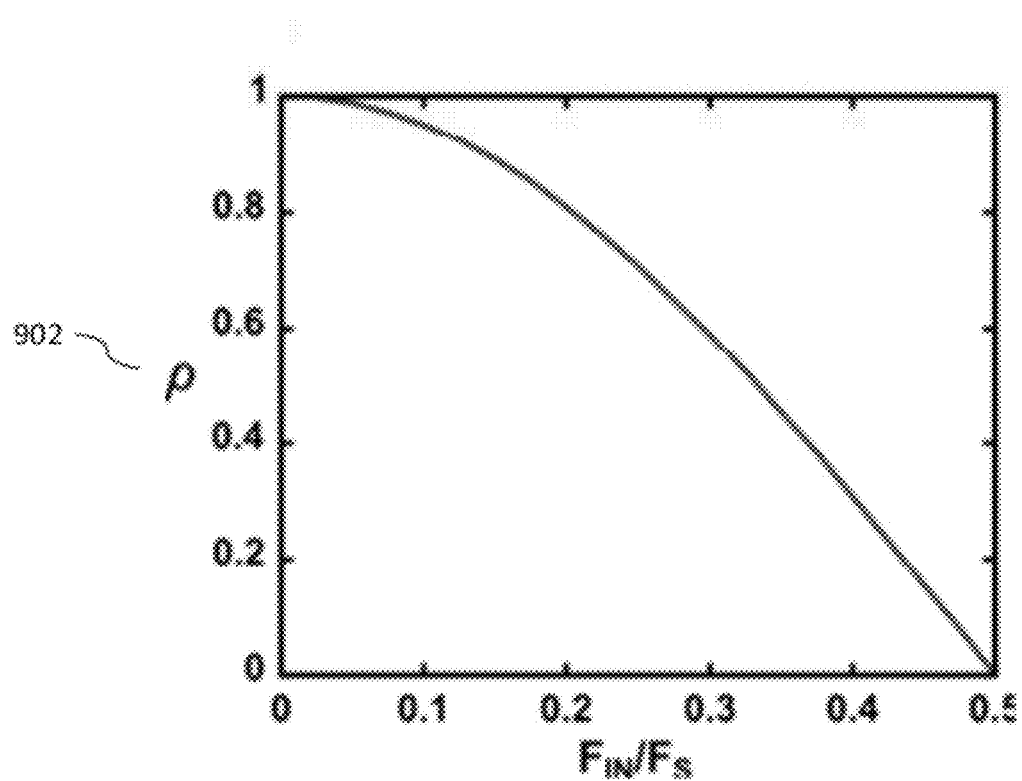
FIG. 9 illustrates an expected correlation between the actual slope of a single-tone input and the estimated slope derived from a discrete-time differentiation of the sampled input signal, according to various embodiments.

FIG. 9 illustrates an expected correlation when comparing the actual slope of a single-tone input with the estimated slope derived from a discrete-time differentiation of the sampled input signal, according to one embodiment. Expected correlation ρ 902 between the actual input slope of a single-tone input and the estimated slope derived from a discrete-time differentiation of the sampled input signal is plotted against the input frequency normalized to the sampling frequency.

As shown in FIG. 9, this approach establishes a good expected correlation ρ 902 between the actual slope and an estimated slope that is generated without additional analog circuitry. Accordingly, for input frequencies contained in the first Nyquist zone, we can now define a possible correlation basis function for the timing skew error as $B_{skew} = D_{ADC}[n] - D_{ADC}[n-1]$, which is a simple first-order difference equation that describes the timing skew error in terms of the difference between the current ADC output word and the previous ADC output word. Note that this basis function is preferred because it gives a good indication of both the polarity and the magnitude of the slope, which is again proportional to the error arising from the timing skew.

Although FIG. 9 illustrates the effectiveness of a simple basis function without additional hardware. It is based on the assumption that the input frequency is relatively lower than the Nyquist frequency. In applications where the input frequency requirements fall in a higher Nyquist zone, for example, in direct digitization of radio frequency input signals, and if the Nyquist zone is known, then the correlation basis function can simply be inverted for the second or even Nyquist zones ($F_S/2-F_S$, $3F_S/2-2F_S$, etc.) or maintained for odd Nyquist zones ($0-F_S/2$, $F_S-3F_S/2$, etc.).

Figure 10:
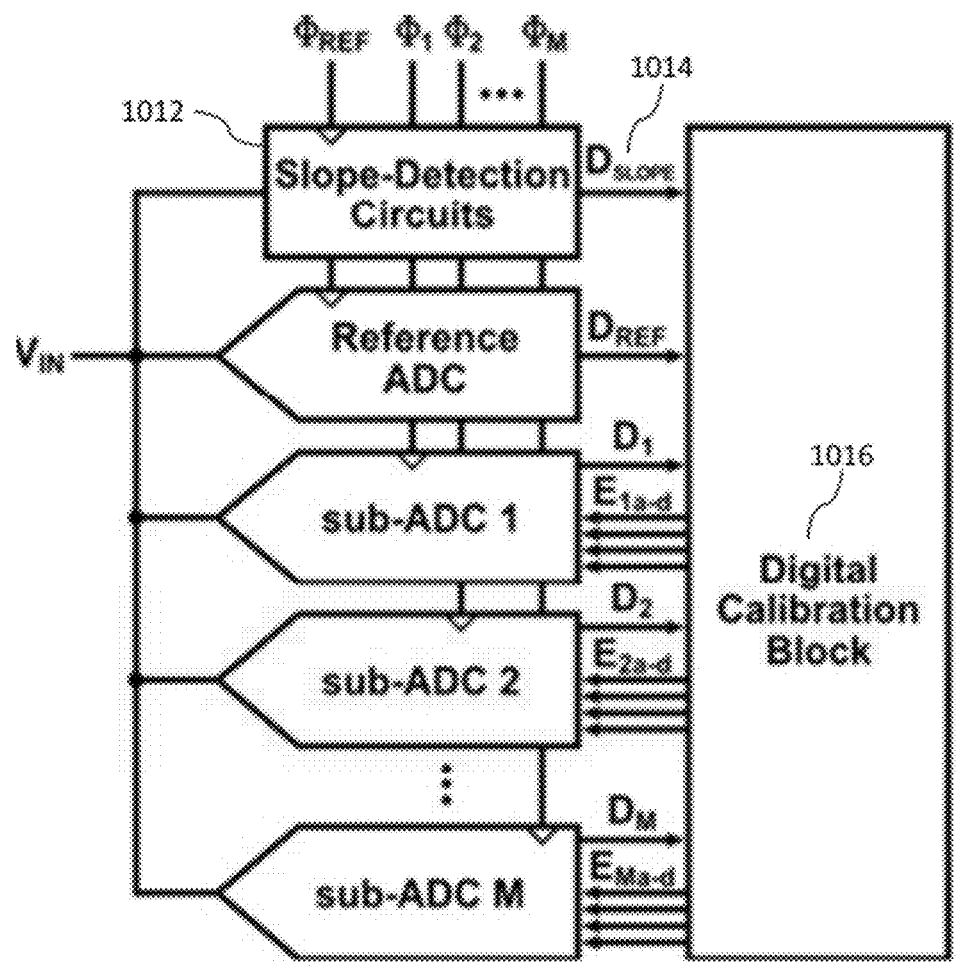
FIG. 10 is a block diagram of an interleaving ADC apparatus, according to various embodiments.

In one embodiment, additional circuitry, such as variable delay elements, comparators, differentiators, and additional ADCs may be employed to more accurately estimate the slope of the input signal. For example, timing delay elements may be combined with one or more comparators to increase the effective sampling rate at around the reference ADC sampling locations, which can be then used for slope polarity estimation. As shown in FIG. 10, additional information 1014 can then be passed to digital calibration block 1016 for use in defining the correlation basis function.

FIG. 10 is a block diagram of an interleaving ADC apparatus with additional slope-detection circuits used for calibration of timing skew, according to various embodiments. For either embodiment of the timing skew calibration, the timing skew error may be corrected through any known analog or digital methods. In one embodiment, a variable delay element is controlled by the error estimate signal. Other methods of generating precise clock phases are also applicable, for example by weighting the sum quadrature clock phases. Post-processing of the ADC output signal to digitally correct for timing skew is significantly more complex, but may be preferred for scaled CMOS technologies.

Figure 11:
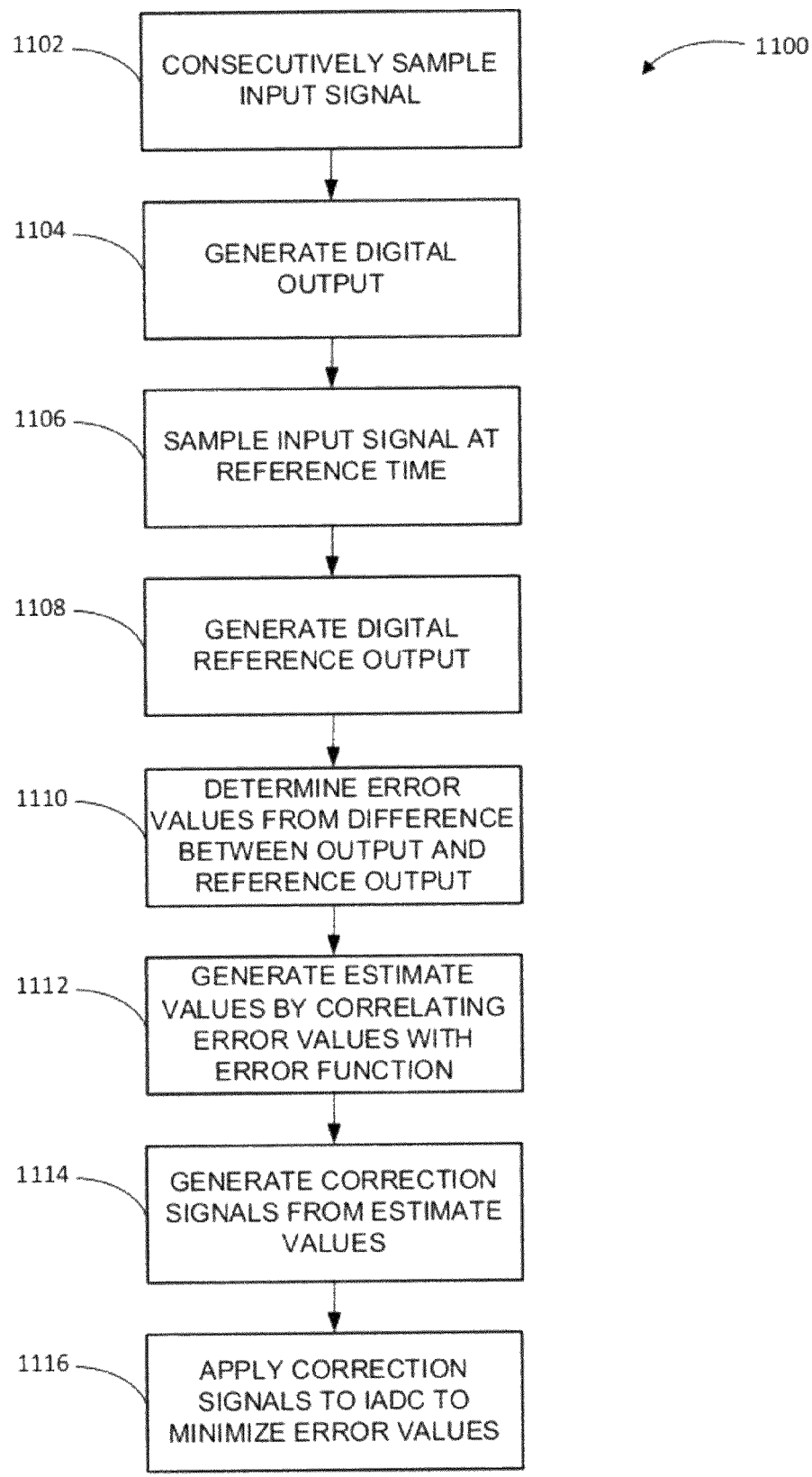
FIG. 11 is a flow chart of an illustrative process for calibrating an I-ADC apparatus in accordance with various embodiments of the invention.

FIG. 11 is a flow chart of an illustrative process for calibrating an I-ADC apparatus comprising a reference ADC and multiple sub-ADCs, in accordance with various embodiments of the invention. At step 1102, an analog input signal is sampled by a number of sub-ADCs at consecutive sampling locations, in response to consecutively phased clock signals. The clock signals can be generated internally or externally and may be delayed by, for example, a variable delay cell prior to sampling.

At step 1104, each sub-ADC converts the analog input signal into a digital output signal.

At step 1106, the analog input signal is sampled by the reference ADC at consecutive sampling locations in response to consecutive clock signals. The sampling locations of the reference ADC are chosen to consecutively align with the sampling locations of each of the sub-ADCs in such a manner that, over time, the reference ADC sampling locations will overlap with sampling locations for each of the sub-ADCs. One skilled in the art will appreciate that the sampling locations can be chosen from a large set of different sequences that allow the reference ADC to align with each sub-ADC.

At step 1108, the reference ADC converts the analog input signal into a digital reference output signal. One skilled in the art will appreciate that steps 1102 and 1106 can performed simultaneously, and that steps 1104 and 1108 can be performed simultaneously.

At step 1110, a channel-to-reference mismatch error is determined from a difference between the digital output signal and the digital reference output signal, for example, by subtracting the reference ADC encoded digital output signal from each sub-ADC output signal.

At step 1112, each channel-to-reference error is correlated with one or more predetermined correlation basis functions to generate an estimate value for each type of error. The correlation basis functions comprises information derived from the analog input signal, such as information about the input slope of the analog input signal at the time of sampling of the reference ADC.

At step 1114, control circuits in the sub-ADC channels generate correction signals from the estimate values. Correction signals may be used to correct for mismatch errors such as, offset mismatch, gain mismatch, and static non-linearity mismatch.

At step 1116, the correction signals are fed back to the respective control circuits of each sub-ADC to minimize the channel-to-reference errors between each sub-ADC and the reference ADC.

It will be appreciated to those skilled in the art that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention. It is, therefore, intended that the claims in the future non-provisional application will include all such modifications, permutation and equivalents as fall within the true spirit and scope of the present invention.

We claim:

1. An interleaved analog-to-digital converter (ADC) comprising:
    a reference ADC coupled to receive an analog signal, the reference ADC generates a digital reference output;
    a plurality of sub-ADCs coupled to receive the analog signal, the plurality of sub-ADCs samples the analog signal at sample locations responsive to a clock and generates a plurality of digital signals corresponding to a sampled portion of the analog signal;
    a calibration block coupled to receive the plurality of digital signals and the digital reference output, the calibration block identifies at least one error value between the plurality of digital signals and the digital reference output; and
    wherein a correlation basis function is applied to the at least one error value to generate an error estimate signal that is used to compensate for the at least one error value, the error value is determined from a difference between at least one of the plurality of digital signals and the digital reference output.

2. The ADC of claim 1, wherein the correlation basis function comprises information regarding a slope of the analog signal.

3. The ADC of claim 1, wherein the at least one error value is representative of a sampling offset error, timing error, bandwidth error, gain error, or static non-linearity error.

4. The ADC of claim 1, wherein the reference ADC is calibrated.

5. The ADC of claim 1, further comprising a multiplier circuit coupled to receive the at least one error value and the correlation basis function to produce the error estimate signal.

6. The ADC of claim 5, wherein the estimate signal is a weighted sum of a plurality of other estimate signals.

7. The ADC of claim 5, further comprising a correction circuit coupled to receive the error estimate signal to reduce the error value for at least one of the sub-ADCs in the plurality of sub-ADCs.

8. A method of calibrating an interleaved analog-to-digital converter (ADC), the method comprising the steps of:
    consecutively sampling an analog signal at a plurality of sample locations;
    sampling the analog signal at reference sample locations that align with the plurality of sample locations in a predetermined sequence;
    converting the analog signal sampled at the sample locations to a plurality of digital outputs;
    converting the analog signal sampled at the reference sample locations to a digital reference output;
    determining at least one error value from a difference between at least one of the plurality of digital outputs and the digital reference output;
    correlating the at least one error value with at least one correlation error function to generate at least one estimate signal;
    generating a correction signal in response to the at least one estimate signal; and
    applying the correction signal to a sub-ADC within the ADC to reduce the at least one error value.

9. The method of claim 8, wherein reducing the at least one error value is performed by a correction circuit within the sub-ADC.

10. The method of claim 8, wherein reducing the at least one error value is achieved by a Least Mean Square calculation process.

11. The method of claim 8, wherein the correction signal corrects a gain mismatch by digitally adjusting a reference voltage within the ADC.

12. The method of claim 8, comprising determining the at least one error value by subtracting the digital reference output from one of the plurality of digital outputs.

13. The method of claim 8, wherein the step of correlating comprises multiplying the at least one error value with a correlation basis function to generate the at least one estimate signal.

14. The method of claim 8, further comprising the step of estimating a slope of the analog input signal.

15. The method of claim 14, further comprising the step of determining a polarity of the estimated slope by performing a discrete time differentiation of the digital output value.

16. The method of claim 8, further comprising the step of post-processing the digital output value to digitally correct the error value.

17. The method of claim 8, further comprising the step of filtering the estimate signal by a low-pass filter to provide a large amount of data oversampling or averaging.

18. The method of claim 8, further comprising the step of calibrating the digital reference output value in the foreground prior to the generation of the correction signal.

19. The method of claim 8, wherein the correlation error function is inverted for even Nyquist zones.

20. An interleaved analog-to-digital converter (ADC) system comprising:
    a clock generator to generate a plurality of clock signals;
    a reference ADC coupled to receive an analog signal, the reference ADC generates a digital reference output;
    a plurality of sub-ADCs coupled to receive the analog signal, the plurality of sub-ADCs samples the analog signal at sample locations responsive to a clock and generates a plurality of digital signals corresponding to a sampled portion of the analog signal;
    a calibration block coupled to receive the plurality of digital signals and the digital reference output, the calibration block identifies at least one error value between the plurality of digital signals and the digital reference output, wherein a correlation basis function is applied to the at least one error value to generate an error estimate signal that is used to compensate for the at least one error value;
    a multiplier circuit coupled to receive the at least one error value and the correlation basis function to produce the error estimate signal; and
    a low-pass filter to filter the error estimate signal.

21. The system of claim 20, comprising an adjustable delay cell coupled to an input of least one of the plurality of ADCs to delay a transmission time of the clock signal.

22. The system of claim 20, further comprising a circuit to generate a slope estimate of the analog input signal.

* * * * *